(12) United States Patent
Ahn et al.

(10) Patent No.: US 6,597,714 B2
(45) Date of Patent: Jul. 22, 2003

(54) SEMICONDUCTOR LASER MODULE

(75) Inventors: Seayoung Ahn, Bethesda, MD (US);
Sang Ho Kim, Kyungki-Do (KR);
Young Jong Yoo, Kyungki-Do (KR);
Dae Wook Kim, Kyungki-Do (KR)

(73) Assignee: Solco Biomedical Co., Ltd., Kyungki-Do (KR)

( * ) Notice: Subject to any disclaimer, the term of this patent is extended or adjusted under 35 U.S.C. 154(b) by 0 days.

(21) Appl. No.: 09/988,043

(22) Filed: Nov. 16, 2001

(65) Prior Publication Data

US 2002/0057718 A1 May 16, 2002

(30) Foreign Application Priority Data

Nov. 16, 2000 (KR) ........................... 2000-67881

(51) Int. Cl.[7] ................................. H01S 3/04
(52) U.S. Cl. ..................... 372/36; 372/38.02
(58) Field of Search ................. 372/36, 38.02

(56) References Cited

U.S. PATENT DOCUMENTS

| | | | | |
|---|---|---|---|---|
| 4,092,614 A | * | 5/1978 | Sakuma et al. ............ 331/94.5 |
| 5,636,029 A | * | 6/1997 | Zimmerman et al. ........ 356/384 |
| 5,745,625 A | * | 4/1998 | Aikiyo et al. ................... 385/94 |
| 5,796,769 A | * | 8/1998 | Ramdani et al. .............. 372/45 |
| 5,977,567 A | * | 11/1999 | Verdiell ........................ 257/99 |
| 6,116,792 A | * | 9/2000 | Kosugi ......................... 385/92 |
| 6,181,718 B1 | * | 1/2001 | Kobayashi et al. ............ 372/34 |
| 6,270,261 B1 | * | 8/2001 | Kawano | |
| 6,396,023 B1 | * | 5/2002 | Aikiyo ..................... 219/117.1 |
| 2002/0000546 A1 | * | 1/2002 | Sato ............................... 257/1 |
| 2002/0018500 A1 | * | 2/2002 | Aikiyo et al. ................. 372/36 |

* cited by examiner

*Primary Examiner*—Paul Ip
*Assistant Examiner*—Leith Al-Nazer
(74) *Attorney, Agent, or Firm*—Birch, Stewart, Kolasch & Birch, LLP

(57) ABSTRACT

A semiconductor laser module includes a casing defining a chamber, light-emitting means fixed to the casing in the chamber, and a fiber optic connector installed so as to communicate the chamber of the casing to outside. The light-emitting means is fixed to the casing by means of a heat sink. The light-emitting means includes a semiconductor chip mounted on the heat sink for generating laser light, a current supply means arranged near the semiconductor chip on the heat sink, and a collimator lens supported by the heat sink so as to oppose the semiconductor chip.

19 Claims, 4 Drawing Sheets

SEMICONDUCTOR LASER MODULE

BACKGROUND OF THE INVENTION (a) Field of the Invention

The present invention relates to a semiconductor laser module for generating laser light.

(b) Description of the Related Art

Typically, lasers have been used in industry for cutting and boring metals and other materials, and for inspecting optical equipment. In medicine, they have been used in surgical operations. Recently, lasers are used in high speed optical data communication together with fiber optics.

A semiconductor laser module generates laser light at a light-emitting device and concentrates the light using a lens so as to output by way of an optical fiber.

In a conventional semiconductor laser module, however, the concentration lens has a restricted concentration rate so as to limit the generation of a high output.

SUMMARY OF THE INVENTION

The present invention has been made in an effort to solve the above problems.

It is an object of the present invention to provide a semiconductor laser module capable of maximizing output energy of laser light by converting the laser light having a z-axis that is longer than a y-axis thereof into a sheet beam having the y-axis that is longer than the z-axis thereof by passing the collimator lens and converging the converted laser light by means of a cylindrical nonlinear self focus lens.

To achieve the above object, the semiconductor laser module of the present invention comprises a casing defining a chamber, light-emitting means fixed to the casing in the chamber, and a fiber optic connector installed so as to communicate the chamber of the casing to the outside. The light-emitting means is fixed to the casing by means of a heat sink and comprises a semiconductor chip mounted on the heat sink for generating laser light, a current supply means arranged near the semiconductor chip on the heat sink, and a collimator lens supported by the heat sink so as to oppose the semiconductor chip.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are incorporated in and constitute a part of the specification, illustrate an embodiment of the invention, and together with the description, serve to explain the principles of the invention.

DETAILED DESCRIPTION OF THE PREFERRED EMBODIMENTS

Preferred embodiments of the present invention will be described hereinafter with reference to the accompanying drawings.

Figure 1:
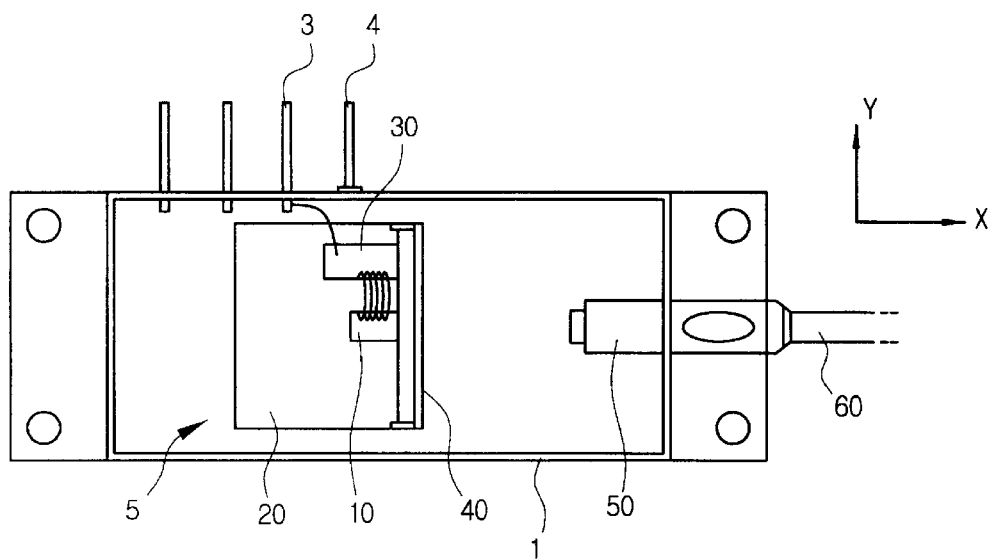
FIG. 1 is a schematic view illustrating a semiconductor laser module according to a preferred embodiment of the present invention.

As shown in FIG. 1, a semiconductor laser module comprises a casing 1 having an inner chamber, a light-emitting device 5 fixed to a rear wall of the casing 1 in the inner chamber of the casing 1, and a fiber optic connector 50 installed at one end of the casing 1 longitudinally along an X-axis so as to communicate the chamber of the casing 1 with the outside.

Figure 3:
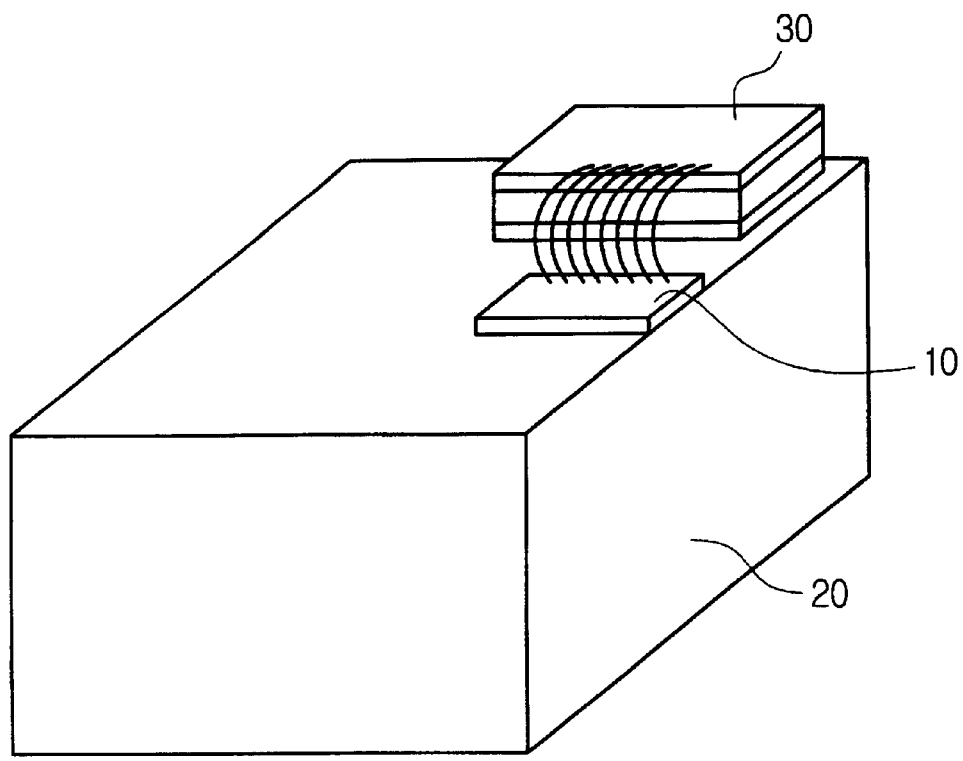
FIG. 3 is a perspective view illustrating a light-emitting means of the semiconductor laser module of FIG. 1.

The light emitting device 5 is fixed to the casing 1 by a heat sink 20 and comprises a semiconductor chip 10, a current supply device 30 arranged near the semiconductor chip 10 on the heat sink 20 (see FIG. 3), and a collimator lens 40 supported by the heat sink 20.

The semiconductor chip 10 is electrically connected to a current supply device 30 such that the semiconductor chip 10 generates light 70 when current is supplied from the current supply device 30.

Figure 4:
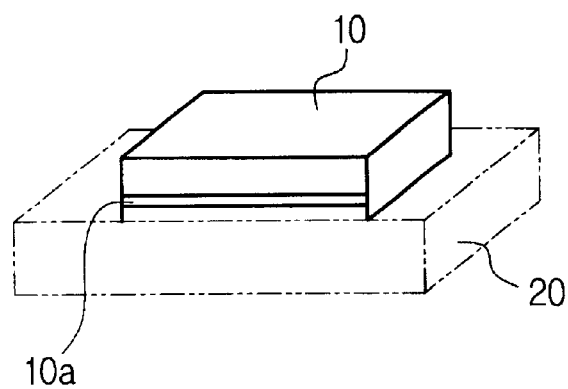
FIG. 4 is a perspective view illustrating a semiconductor chip of the light-emitting device of FIG. 3.

As shown in FIG. 4, the semiconductor chip 10 has an active region 10a formed in a quantum well structure such that the generated light is emitted from a light emitting surface that faces the fiber optic connector 50.

The active region 10a of the semiconductor chip 10 is formed having a predetermined distance from the heat sink 20 so as to effectively transmit the heat generated at the semiconductor chip to the heat sink 20.

The semiconductor chip 10 is one that has a quantum well structure of relatively high efficiency of 70–80%. The size of the semiconductor chip 10 is 300 $\mu$m~500 $\mu$m in width, 600 $\mu$m~1000 $\mu$m in length, and 100 $\mu$m in height. Also, the active region 10a is formed with a gap of substantially 2 $\mu$m from the heat sink 20, and its size is 1×100 $\mu$m or 1×200 $\mu$m.

This method, which is referred to as an "upside-down mount," in which the active region 10a of the semiconductor chip 10 is formed near the heat sink 20, is adapted for efficiently cooling the heat produced when generating the laser light without an additional cooling mechanism such as water-cooling.

Figure 5:
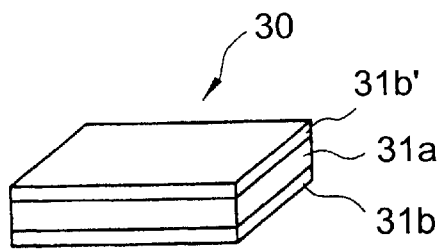
FIG. 5 is a perspective view illustrating a current supply means of the light-emitting means of FIG. 3.
Figure 6:
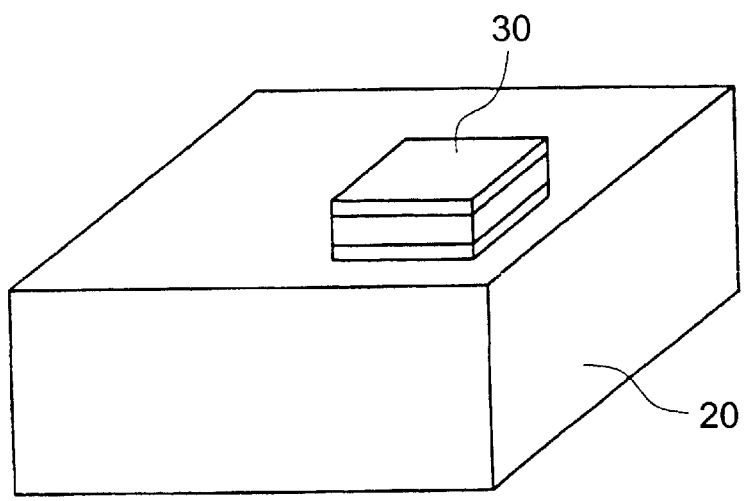
FIG. 6 is a perspective view illustrating fixation of the current supply means of the light-emitting device of FIG. 3.

As shown in FIG. 5, the current supply device 30 comprises a dielectric layer 31a sandwiched between positive and negative electrode layers 31b and 31b'. The current supply device 30 is mounted on the heat sink 20 by soldering the surface of the positive electrode layer 31b' thereto.

That is, the semiconductor chip 10 is connected to the negative electrode layer 31b of the current supply device 30 by way of a plurality of wires and is connected to the positive electrode layer 31b' of the current supply device 30 by the heat sink 20. The heat sink 20 acts as a positive electrode to the semiconductor chip 10.

Also, the negative electrode layer 31b is connected to a current source (not shown) via a negative lead 3 of the casing 1 and the positive electrode layer 31b' is connected to the current source via the heat sink 20 and a positive lead 4 of the casing 1. Accordingly, the negative current is supplied to the negative electrode layer 31b' of the current supply device 30 via the negative lead 3 and the positive current is supplied to the positive electrode layer 31b of the current supply device 30 via the positive lead 4 and the heat sink 20.

The collimator lens 40 is arranged having a predetermined distance from the semiconductor chip 10 that is on an optical axis of the collimator lens 40 such that the laser light generated from the semiconductor chip 10 is emitted through the collimator lens 40.

The collimator lens 40 is arranged in such a way that the optical axis of the collimator lens 40 is aligned in parallel with a p-n junction of the semiconductor chip 10 so as to efficiently emit the laser light generated from the active region 10a of the semiconductor chip 10.

The collimator lens 40 is a cylindrical micro lens having a diameter of 100 $\mu$m. Also, the collimator lens 40 is formed having a length of 1800 $\mu$m that is 9 times or 18 times longer than the x-axis length of the active region 10a of the semiconductor chip 10 so as to facilitate mounting the collimator lens 40 to the heat sink 20. Additionally, if the collimator lens 40 is long, the heat generated by the laser light can be easily radiated.

Even though the collimator lens 40 is located near the semiconductor chip 10, the distance from the semiconductor chip 10 should be greater than or equal to R/2, where R is the diameter of the collimator lens 40.

By reducing the distance between the semiconductor chip 10 and the collimator lens 40, it is possible to reduce the volume of the laser and improve the transmission efficiency.

In the present invention, the collimator lens 40 is made of fiber optics so as to simplify the manufacturing process and reduce manufacturing costs.

The collimator lens 40 is fixed to the heat sink 20 by an epoxy that has a high adhesive property and dielectric characteristics.

It is preferred that the heat sink is made of copper and the wires are made of gold.

Figure 2:
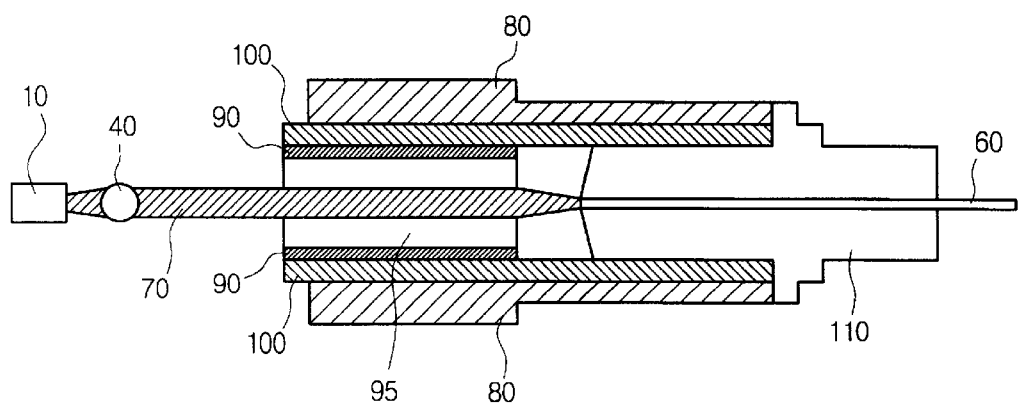
FIG 2 is a cross sectional view of a fiber optic connector for illustrating an optical path of the semiconductor laser module of FIG. 1.

The fiber optic connector 50 comprises a barrel 80 which is air-tightly fixed to the casing 1 through an opening formed coaxial with the optical axis, a sleeve 100 fixedly inserted into the barrel 80, a cylindrical lens holder 90 fixedly inserted into the sleeve 100 inside of the fiber optic connector 50, a convergence lens 95 tightly fixed in the lens holder 90 so as to be aligned coaxial with the collimator lens 40, and a fiber optic holder 110 tightly inserted into the sleeve 100 from the outside. A fiber optic 60 is inserted into a longitudinal hole formed along an axis of the fiber optic holder 110 (see FIG. 2).

The barrel 80 is fixed to the casing 1 by soldering.

Figure 7A:
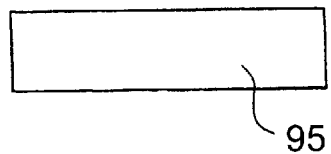
FIGS. 7A and 7B are drawings for illustrating the convergence lens of the light-emitting means of FIG. 1.
Figure 7B:
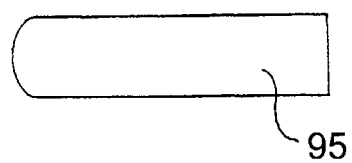
Figure 8A:
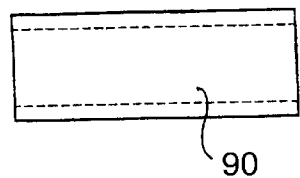
FIGS. 8A and 8B are drawings for illustrating a lens holder of a fiber optic connector of FIG. 2.
Figure 8B:
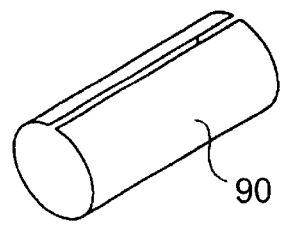

The convergence lens 95 is a non-linear self-focus lens having a cylindrical shape such that its thickness is greater than its diameter so as to enlarge the degree of convergence. Both surfaces of the convergence lens 95 are flat (see FIG. 7A) or convex (see FIG. 7B).

Figure 9:
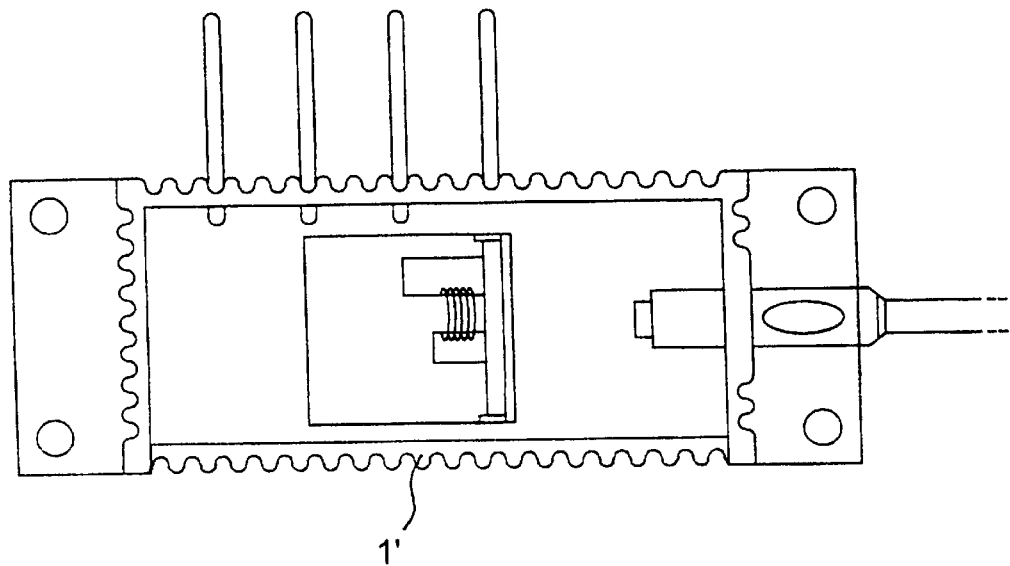
FIG. 9 is a drawing for illustrating a casing of the semiconductor laser module according to another embodiment of the present invention.

The convergence lens 95 can be further fixed in the lens holder 90 by means of a ferrule shown in FIG. 9.

The inner chamber of the casing 1 is filled up with $N_2$ gas and is air-tightly sealed, after all of the components of the semiconductor laser module are accommodated, for life span and protection of the components.

As shown in FIG. 9, the casing 1' of the semiconductor laser module can be formed such that the outer surface thereof has an indented formation for enhancing radiation of the heat generated in the semiconductor laser module.

The operation of the above-structured semiconductor laser module will be described hereinafter.

The light 70 generated at the semiconductor chip 10 accesses to the collimator lens 40 as a sheet beam having approximately 106 $\mu$m in length of the x-axis and 33 $\mu$m in height of the z-axis, provided that the optical axis of the collimator lens 40 is the x-axis.

In this case the collimator lens 40 has an 80% light transmission efficiency when the active region 10a has the size of 1 $\mu$m×100 $\mu$m.

That is, the laser light transmission efficiency of the collimator lens 40 is determined according to the size of the active region 10a and a light emission angle becomes an important parameter for determining the light transmission efficiency of the collimator lens 40.

For example, the light transmission efficiency of the collimator lens 40 is 80% when the size of the active region 10a is 1 $\mu$m×100 $\mu$m, and it becomes 70~75% when the size of the active region 10a is 1 $\mu$m×200 $\mu$m.

The laser light 70 is converted into another shape of a sheet beam having a long diameter in the y-axis relative to the z-axis by passing through the collimator lens 40. This converted laser beam can be transmitted into the fiber optic 60 through the convergence lens 95 with over a 97% light transmission efficiency.

As described above, in the present invention the laser light having a long height in the z-axis relative to the width of the y-axis is converted into the sheet beam having a long width in the y-axis relative to the height of z-axis passing through the collimator lens such that the light transmission efficiency is improved, resulting in the production of a high energy optical signal.

Also, in the present invention, the non-linear self-focusing lens is used as the convergence lens. Accordingly, it is possible to reduce the distance for converging the laser light, resulting in a minimizing of the size of the semiconductor laser module.

Also, since the active region 10a of the semiconductor chip is located near the heat sink 20, it is possible to efficiently radiate the heat generated when the semiconductor chip 10 produces the laser light.

Since the distance between the semiconductor chip 10 and the collimator lens 40 is minimized, it is possible to reduce the volume of the laser and improve the transmission efficiency.

Furthermore, since the collimator lens is made of fiber optics, manufacturing is and the manufacturing cost reduces.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims,

What is claimed is:

1. A semiconductor laser module comprising:
   a casing defining a chamber;
   a light-emitting device fixed to the casing in the chamber; and a fiber optic connector installed so as to communicate the chamber of the casing to an environment outside the casing, wherein the light-emitting device is fixed to the casing by a heat sink and comprises:
  a semiconductor chip mounted directly on the heat sink for generating laser light;
  a current supply device arranged near the semiconductor chip and mounted directly on the heat sink, said current supply device including a dielectric layer formed between positive and negative electrode layers; and
  a collimator lens supported by the heat sink so as to oppose the semiconductor chip.

2. The semiconductor laser module of claim 1, wherein the semiconductor chip has an active region formed between positive and negative layers.

3. The semiconductor laser module of claim 2, wherein the active region of the semiconductor chip is formed having a predetermined distance from the heat sink for effectively transmitting the heat generated at the semiconductor chip to the heat sink.

4. The semiconductor laser module of claim 3, wherein the semiconductor chip generates a sheet beam having a y-axis that is longer than a z-axis thereof by passing the collimator lens.

5. The semiconductor laser module of claim 1, wherein the current supply device is mounted directly on the heat sink by soldering the surface of the positive electrode layer thereto.

6. The semiconductor laser module of claim 1, wherein the heat sink acts as a positive electrode to the semiconductor chip.

7. The semiconductor laser module of claim 1, wherein the collimator lens is aligned having a predetermined distance from the semiconductor chip.

8. The semiconductor laser module claim 7, wherein the collimator lens is a cylindrical micro lens having a diameter of 100 $\mu$m.

9. The semiconductor laser module of claim 7, wherein a thickness of the collimator lens is 9 or 18 times longer than a length of the active region of the semiconductor chip in a direction of the optical axis of the collimator lens.

10. The semiconductor laser module of claim 9, wherein the thickness of the collimator lens is 1800 $\mu$m.

11. The semiconductor laser module of claim 7, wherein the distance between the semiconductor chip and the collimator lens is greater than or equal to R/2, where R is a diameter of the collimator lens.

12. The semiconductor laser module of claim 7, wherein the collimator lens has flat front and rear surfaces relative to a light proceeding direction.

13. The semiconductor laser module of claim 7, wherein the collimator lens has a convex front surface and a flat rear surface relative to a light proceeding direction.

14. The semiconductor laser module of claim 1, wherein the fiber optic connector comprises:
  a barrel which is air-tightly fixed to the casing through an opening formed coaxial with the optical axis of the collimator lens;
  a sleeve fixedly inserted into the barrel;
  a cylindrical lens holder fixedly inserted into the sleeve;
  a convergence lens tightly inserted into the lens holder from inside the chamber of the casing; and
  a fiber optic holder tightly inserted into the sleeve from outside of the casing.

15. The semiconductor laser module of claim 14, wherein the convergence lens is aligned with the optical axis of the collimator lens.

16. The semiconductor laser module of claim 15, wherein a fiber optic is tightly inserted into a hole of the fiber optic holder so as to align with the optical axis of the convergence lens.

17. The semiconductor laser module of claim 14, wherein the convergence lens is a non-linear self-focus lens having a cylindrical shape.

18. The semiconductor laser module of claim 1, wherein the casing is provided with an indented outer surface for enhancing radiation of heat generated inside of the casing.

19. The semiconductor laser module of claim 1, wherein the chamber of the casing is filled up with $N_2$ gas.

* * * * *